(12) United States Patent
Yalamanchili

(10) Patent No.: US 11,649,541 B2
(45) Date of Patent: May 16, 2023

(54) PVD COATINGS WITH A HEA CERAMIC MATRIX WITH CONTROLLED PRECIPITATE STRUCTURE

(71) Applicant: Oerlikon Surface Solutions AG, Pfäffikon, Pfäffikon (CH)

(72) Inventor: Siva Phani Kumar Yalamanchili, Sargans (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 17/288,269

(22) PCT Filed: Oct. 28, 2019

(86) PCT No.: PCT/EP2019/079396
§ 371 (c)(1),
(2) Date: Apr. 23, 2021

(87) PCT Pub. No.: WO2020/084166
PCT Pub. Date: Apr. 30, 2020

(65) Prior Publication Data
US 2021/0388481 A1 Dec. 16, 2021

Related U.S. Application Data

(60) Provisional application No. 62/750,999, filed on Oct. 26, 2018.

(51) Int. Cl.
*C23C 14/06* (2006.01)
*C23C 14/34* (2006.01)
(Continued)

(52) U.S. Cl.
CPC .......... *C23C 14/0641* (2013.01); *C23C 14/34* (2013.01); *C23C 14/543* (2013.01); *C23C 14/5813* (2013.01)

(58) Field of Classification Search
CPC ... C23C 14/0641; C23C 14/34; C23C 14/543; C23C 14/5813; C23C 14/5806;
(Continued)

(56) References Cited

U.S. PATENT DOCUMENTS 6,037,052 A * 3/2000 Chen ................. G11B 5/70678
428/218
11,141,791 B2 10/2021 Fujieda et al.
(Continued)

FOREIGN PATENT DOCUMENTS

CN 102828139 A 12/2012
CN 104630706 A 5/2015
(Continued)

OTHER PUBLICATIONS

Nagase, et al., In-situ TEM observation of structural changes in nano-crystalline CoCrCuFeNi multicomponent high-entropy alloy under fast electron irradiation by high voltage electron microscopy, 2015, Intermetallics, 59, 32-42 (Year: 2015).*
(Continued)

*Primary Examiner* — Jennifer Wecker
*Assistant Examiner* — Patrick S Ott
(74) *Attorney, Agent, or Firm* — Michael J. Blessent; Bret E. Field; Bozicevic, Field & Francis LLP

(57) ABSTRACT

The present invention discloses a PVD coating process for producing a multifunctional coating structure comprising the steps of producing a HEA ceramic matrix on a substrate and the targeted introduction of a controlled precipitate structure into the HEA ceramic matrix to generate a desired specific property of the coating structure.

7 Claims, 3 Drawing Sheets

Figure 1:
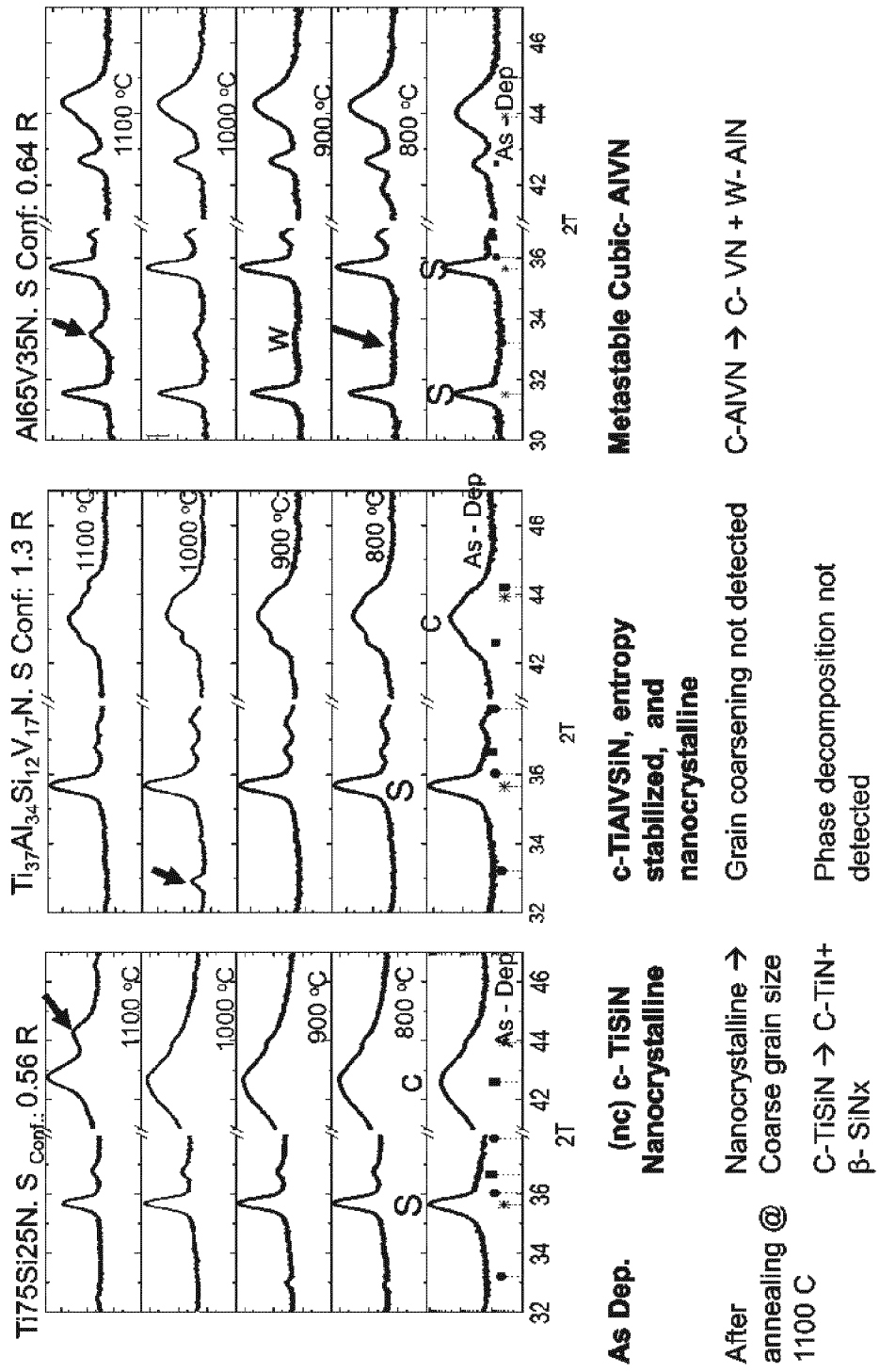

(51) Int. Cl.
*C23C 14/54* (2006.01)
*C23C 14/58* (2006.01)

(58) Field of Classification Search
CPC ... C23C 14/5846; C23C 14/58; C23C 14/325; C23C 14/3485; C23C 14/35
See application file for complete search history.

(56) References Cited

U.S. PATENT DOCUMENTS

| | | | |
|---|---|---|---|
| 2009/0301610 | A1 | 12/2009 | Gillon et al. |
| 2012/0152337 | A1* | 6/2012 | Aytug ............... H01L 31/072 257/E31.032 |
| 2017/0314097 | A1 | 11/2017 | Hong et al. |
| 2018/0277541 | A1* | 9/2018 | Gluschenkov .... H01L 21/76814 |

FOREIGN PATENT DOCUMENTS

| | | | | |
|---|---|---|---|---|
| CN | 104789847 | A | | 7/2015 |
| CN | 106835037 | A | * | 6/2017 |
| CN | 106835037 | A | | 6/2017 |
| CN | 108103494 | A | * | 6/2018 |
| CN | 108103494 | A | | 6/2018 |
| CN | 108336062 | A | * | 7/2018 ......... C23C 14/0641 |
| CN | 108699643 | A | | 10/2018 |
| JP | 2000290785 | A | | 10/2000 |
| KR | 20170106016 | A | * | 9/2017 |

OTHER PUBLICATIONS

Meng, et al., Nitriding of a high entropy FENiMnAlCr alloy, 2015, Journal of Alloys and Compounds, 645, 376-381 (Year: 2015).*
CN-108103494-A Translation (Year: 2018).*
CN-106835037-A Translation (Year: 2017).*
KR-20170106016-A Translation (Year: 2017).*
CN-108336062-A Translation (Year: 2018).*
International Preliminary Report on Patentability for PCT Application No. PCT/EP2019/079396 dated Apr. 27, 2021, 7 pages.
Tsai et al., Thermally stable amorphous (AlMoNbSiTaTiVZr) 50N50 nitride film as diffusion barrier in copper metallization, Applied Physics Letters, AIP Publishing LLC, US, vol. 92, No. 5, Feb. 8, 2008, pp. 52109-1-52109-3.
Office Action for Chinese Application No. 201980069551.4 dated Dec. 1, 2022, with its English translation, 26 pages.
Office Action for European Application No. 19798551.8 dated Feb. 2, 2023, 5 pages.

* cited by examiner

PVD COATINGS WITH A HEA CERAMIC MATRIX WITH CONTROLLED PRECIPITATE STRUCTURE

The present invention relates to the production of a multifunctional coating structure, comprising a high entropy alloy (HEA) ceramic matrix and a controlled precipitate structure located inside the HEA ceramic matrix as well as to a corresponding multifunctional coating structure.

STATE OF THE ART

Micro-structure design of coatings synthesized by PVD processes like Arc deposition, Sputter deposition etc. are already known.

However current micro structure of PVD coatings typically consists of one of the following (a) columnar, (b) multilayer, (c) nano-composite, and (d) amorphous alloy. The micro-structure typically consists of similar host materials, i.e. either nitrides or carbides, or borides or a mixture of them as a solid solution, but not as their individual phases.

An example can be a coating comprising a nitride host and oxide precipitates. This kind of micro-structure offers a multi-functional purpose i.e. a combination of high hardness from nitrides, and high temperature lubrications from suitable choice of oxides such as for example $V_2O_5$.

Another example are hexagonal-BN precipitates in a carbide host. Here the host provides the necessary structural stability and high temperature properties, and H—BN offers solid lubrication.

The matrix consists typically of metastable phases such as for example TM-Al—N or TM-Si—N etc., where TM means transition metal. At elevated temperatures, these metastable phases undergo phase transformations at elevated temperatures >900° C. by the following reaction:

$$c\text{-TM-Al—N} \rightarrow \text{cubic-TMN} + w\text{—AlN} \quad (1)$$

$$c\text{-TM-Si—N} \rightarrow \text{cubic-TMN} + \text{SiN} \quad (2)$$

These structural changes are undesirable, as they are typically associated with undesirable volume change and simultaneously reduced mechanical properties.

OBJECTIVE OF THE PRESENT INVENTION

It is an object of the present invention to alleviate or to overcome one or more difficulties related to the prior art. In particular, it is an object of the present invention to provide a PVD coating process that enables the production of a phase stable designable multifunctional coating structure.

DESCRIPTION OF THE PRESENT INVENTION

In order to overcome these problems a method comprising two steps has been invented:
First step: Producing a high entropy alloy matrix.
Second step: Developing a controlled precipitate structure, preferably semi-coherent to the matrix.

Thus, in a first aspect of the present invention disclosed is a PVD coating process for producing a multifunctional coating structure comprising the steps of:
Producing a HEA ceramic matrix on a substrate,
Targeted introduction of a controlled precipitate structure into the HEA ceramic matrix to generate a desired specific property of the coating structure.

Hereby, the HEA ceramic matrix can preferably be deposited by means of a PVD coating process on a suitable substrate, wherein the substrate is formed at least partially from a metal compound. Preferably a plurality, in particular a multiplicity of precipitate structures is formed in accordance with the invention. In the context of the present invention the term "high entropy alloys (HEA)" is preferably used to describe a class of materials consisting of at least 5 components, wherein particularly each component is present in a concentration between 10 at. % and 30 at. % and wherein the corresponding material exhibits an estimated configurational entropy, S conf.>1.4R.

In another example of the first aspect, the selective introduction of a controlled precipitate structure takes place via a thermal treatment, wherein the HEA ceramic matrix preferably being heated up to 1000° C., in particular above 1000° C. during the thermal treatment.

In another example of the first aspect, a variation of the selective introduction of a controlled precipitate structure takes place by varying the treatment time and/or the treatment temperature.

In another example of the first aspect, only a few nm, preferably less than 50 nm, in particular less than 10 nm, is heated directly in the HEA ceramic matrix layer by means of the thermal treatment.

In another example of the first aspect, the targeted introduction of the controlled precipitate structure into the HEA ceramic matrix takes place in situ during the production of the HEA ceramic matrix. Hereby, the controlled precipitate structure can be introduced into the HEA ceramic matrix by means of an instantaneous heating source for heating the surface of the HEA ceramic matrix to a temperature of between 900 and 1000° C. within a few seconds, wherein the instantaneous heating source preferably being in the form of a laser, in particular a nanosecond laser.

Hereby, in the context of the invention, heating of the surface is understood in particular to mean heating up to a penetration depth of a few nm, preferably less than 100 nm. Furthermore, the instantaneous heating source can be formed in such a way that, in a heating process, only an area of a few nm, preferably less than 100 nm, is heated up. As an alternative to a laser, the instantaneous heating source can also be formed in the form of a filament, in particular a heating filament or the like.

In another example of the first aspect, the targeted introduction of the controlled precipitate structure into the HEA ceramic matrix takes place after the production of the HEA ceramic matrix, preferably by means of after-annealing on an after-annealing line.

In another example of the first aspect, the HEA matrix is deposited on a substrate by applying a negative bias voltage to the substrate during the coating process, wherein the bias voltage being <200 V, preferably <150 V, in particular <120 V.

In another example of the first aspect, the production of the HEA ceramic matrix and/or the controlled precipitate structure takes place within a reactive atmosphere, wherein the reactive atmosphere preferably comprising nitrogen and/or oxygen and/or methane.

In another example of the first aspect, a sputtering technique, in particular HiPIMS or an ARC PVD process, is used as the PVD coating process.

In another example of the first aspect, the substrate temperature during the production of the HEA ceramic matrix and/or the controlled precipitate structure is between 100° C. and 400° C., preferably between 150° C. and 300° C., in particular between 200° C. and 250° C.

In a second aspect a multifunctional coating structure obtainable by a process mentioned before is disclosed, wherein the multifunctional coating structure comprises a HEA ceramic matrix and a precipitate structure arranged within the HEA ceramic matrix to ensure a specific property of the coating structure. According to the second aspect, the precipitate structure can be especially semi-coherent to the HEA ceramic matrix.

In another example of the second aspect, the HEA ceramic matrix comprises nitrides and/or carbides and/or oxides and/or borides. According to the second aspect, the HEA ceramic matrix may also include silicides or oxynitrides and can also be formed as multi anion compound.

In another example of the second aspect, the HEA ceramic matrix comprises elements of the IV and/or V and/or VI group of the Periodic Table of Elements, preferably at least one of the elements Ti, Zr, Va, Nb, Ta, Cr, Mo or W.

In another example of the second aspect, the HEA ceramic matrix comprises Si, preferably as the largest component in terms of atomic quantity. According to the second aspect, it has been found that the addition of Si improves the oxidation stability of a given multi-functional coating structure, particularly in the case of high-temperature treatment.

In another example of the second aspect, the HEA ceramic matrix comprises Ti and/or Al and/or Si and/or V. According to the second aspect, the HEA ceramic matrix may also contain other elements, preferably other transition metals.

In another example of the second aspect, the HEA ceramic matrix comprises Ti, Al, Si and V, wherein the HEA ceramic matrix preferably being formed in the form of TiAlSiVN, in particular in the form of $Ti_{37}Al_{34}Si_{12}V_{17}N$. According to the second aspect, an AlCrNbTaTiSiN matrix may also be provided, by addition of silicon to a AlCrNbTaTiN matrix.

In another example of the second aspect, the HEA ceramic matrix is phase stable up to a temperature of 1000° C., preferably phase stable up to a temperature of 1100° C.

In another example of the second aspect, the precipitate structure is designed to ensure one of the following specific properties: improvement of structural stability, improvement of lubricating properties, improvement of temperature resistance. Furthermore, the precipitate structure can be selected in particular with regard to its compatibility with the HEA ceramic matrix.

In another example of the second aspect, the precipitate structure is formed in the form of oxides and/or carbides and/or borides, in particular in the form of BN and/or $Al_2O_3$ and/or VC.

In another example of the second aspect, the precipitate structure has a size of less than 100 nm, preferably less than 50 nm, in particular less than 10 nm.

In another example of the second aspect, the layer thickness of the coating structure is less than 500 nm, preferably less than 300 nm, in particular less than 200 nm.

In a third aspect a use as functional coating, particularly for wear resistant coatings or decorative coatings is disclosed.

The invention will now be described in more details based on examples and with the help of the figures.

DETAILED DESCRIPTION

Figure 2:
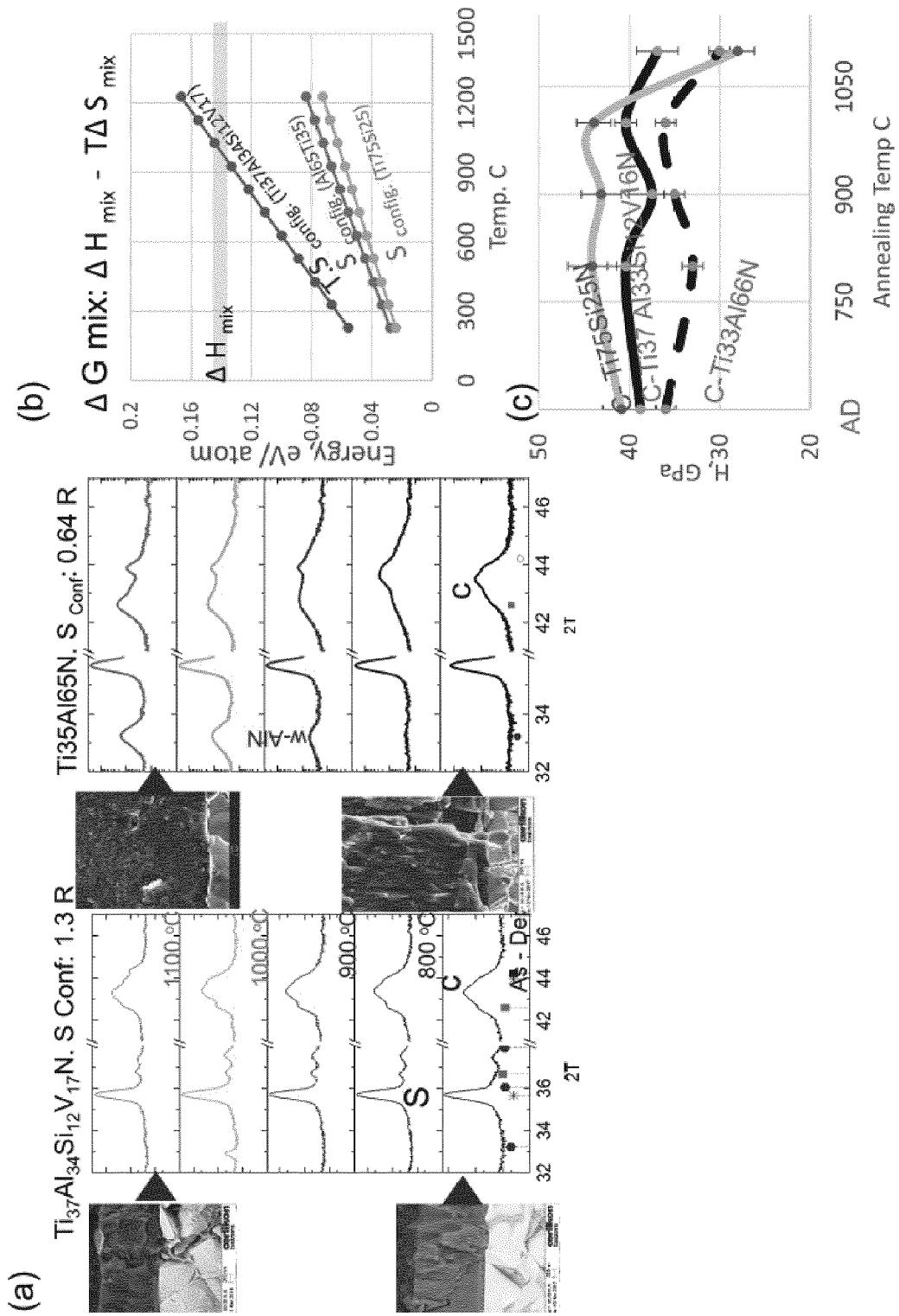
Figure 3:
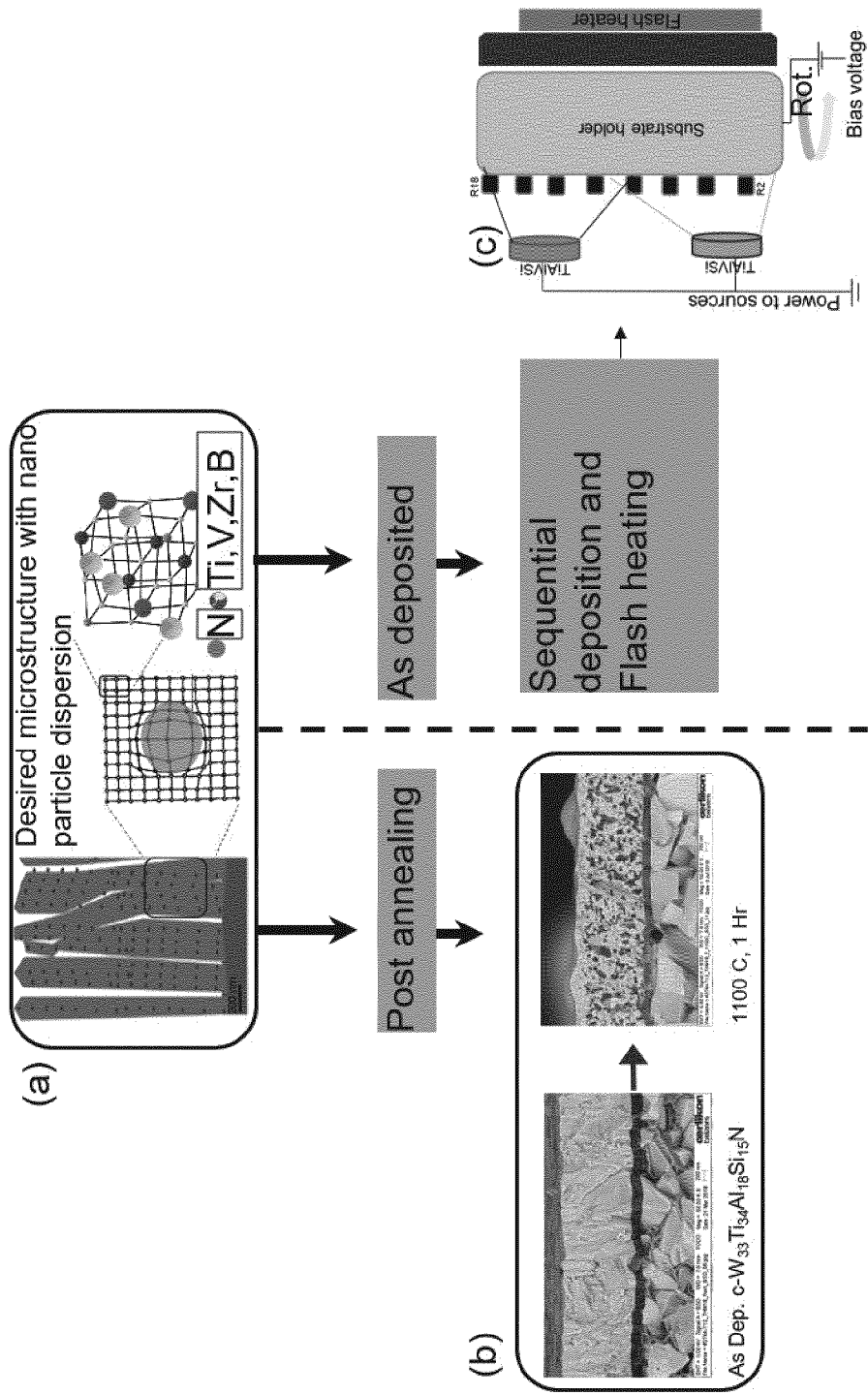

FIG. 1 shows the structural evolution as a function of temperature for different alloys, FIG. 2 shows the structural evolution as a function of temperature for different alloys (a), the evolution of T.S config. as a function of temperature (b), and the hardness evolution as a function of annealing temperatures for different alloys (c), FIG. 3 shows the inventive microstructure of HEA matrix with controlled precipitates (a), an x-SEM image in BSE contrast, wherein the proposed structure is formed by thermal annealing (b), and a schematic representation of sequential coating deposition and flash heating (c).

FIG. 1 shows the structural evolution as a function of temperature for different alloys, particularly FIG. 1 shows a comparison of the XRD evolution of AlVTiSiN with known metastable alloys of c-Ti—Al—N and c-Ti—Si—N.

In contrast to the metastable alloy, the proposed multi-principal high entropy alloy of $Ti_{37}Al_{34}Si_{12}V_{17}N$ does not show any phase transformations. In spite the alloy has immiscible components of AlN and $Si_3N_4$, and the cubic phase solid solution is retained after annealing of 1100° C.

The alloy c-TiSiN in its deposited state as shown in FIG. 1 forms a nano-crystalline phase as evident from the broad XRD cubic phase. However, at elevated temperature the peak becomes narrower indicating a grain growth process, with precipitation of undesirable phases as marked by arrow.

In contrast, for example in TiAlSiVN alloy, the nano-crystallinity is retained, and the cubic solid solution is preserved after 1100° C. annealing, as can be seen in the corresponding XRD diffractogram.

FIG. 2a shows the structural evolution as a function of temperature for different alloys. The images on the left side of the XRDs are cross-sectional SEMs of fractured coating on BSE mode. Note that the as deposited cubic solid solution is retained in the alloy of $Ti_{37}Al_{34}Si_{12}V_{17}N$ after annealing to 1100° C. but not in the case of $Ti_{35}Al_{65}N$ as confirmed by the SEM image of fractured coating. In FIG. 2a the fractured image does not show any structural or contrast changes indicating the phase changes for the $Ti_{37}Al_{34}Si_{12}V_{17}N$ alloy. In contrast, the SEM image of TiAlN coating in cross-sectional view shows a structural change from columnar to a fine granular structure with local contrast variations corresponding to phase changes.

FIG. 2b evaluates the thermodynamic driving force for the cubic phase stabilization by considering the values of $H_{mix}$ (enthalpy of mixing), this is the energy penalty to cause mixing, and the energy gain caused by configurational entropy S conf.

In FIG. 2b, the evolution of T.S configuration, and $H_{mix}$ as a function of temperature for different alloys were estimated. Note that for the alloy $Ti_{37}Al_{34}Si_{12}V_{17}N$ the value of $T.S_{conf}$ over comes $H_{mix}$ there by solid solution is energetically more preferable compared to their binary nitrides, this is not the case for TiSiN, and AlVN. For the alloy of $c-Al_{65}V_{35}N$, and $c-Ti_{35}Al_{65}N$ in FIG. 2b a cubic phase is formed as deposited state, and the alloy undergo decomposition as evidenced in the XRD above annealing of 900 C. The evolution of w-AlN in the XRD of $c-Al_{65}V_{35}N$, and $c-Ti_{35}Al_{65}N$ represents following decomposition pathway.

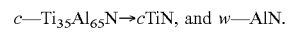

$c—Ti_{35}Al_{65}N \rightarrow cTiN$, and $w—AlN$.

Thermodynamic parameters in FIG. 2b, i.e $H_{mix}$ of the alloys was estimated using Density functional theory calculations, and S conf. is estimated by formulism using Boltzmann equation, assuming random solid solution model.

The above alloy of $Ti_{37}Al_{34}Si_{12}V_{17}N$ is only an example, experts in the field realize similar entropy stabilized multi-principal nitrides, can be synthesized from group IV, V, and VI elements in the periodic table.

The high thermal stability of this alloy is caused by the formation of entropy stabilized solid solution as shown in FIG. 2b. Only for the alloy of c-TiAlSiVN the TΔSconfig.mix is greater than $\Delta H_{mix}$, at a temperature above 1000° C. Thereby $\Delta G_{mix}$ of the alloy is lower in the solid solution form in relation to their competing phases. Where T is temperature, S config. is the configurational entropy, $G_{mix}$ is the free energy of mixing and R is Gas constant.

FIG. 2c shows the hardness evolution as a function of annealing temperature for different alloys. Note that the thermally stable alloy of $Ti_{37}Al_{34}Si_{12}V_{17}N$ also shows a relatively stable hardness as a function of annealing temperature. Especially at temperature above 1000° C., where the alloy decomposition is triggered. The entropy stabilized $Ti_{37}Al_{34}Si_{12}V_{17}N$ alloy also shows a relatively stable hardness up to annealing temperature of 1100° C. as shown in FIG. 2c The second step of the first aspect of the present invention is schematically shown in FIG. 3. The matrix can be any high entropy alloy ceramic of nitride, carbide, oxide, and boride. The precipitate composition is carefully chosen that it imparts either additional strengthening or it induces additional functionalities like lubrication etc. Also the precipitate composition and structure chosen in a way that they do not induce undesirable stresses.

The composition and structure of precipitate can be similar or different, for example: H—BN in HEA nitride or HEA carbide alloy. The controlled precipitate structure can form during the as deposited state in-situ or via a post annealing route.

According to a first example the proposed microstructure comprises two components as presented in FIG. 3a. The first component is used to form an entropy stabilized ceramic matrix.

The second component is to form a controlled precipitates in the structure. The pathways to form the desired microstructure is schematically presented in FIG. 3. The precipitates can be any oxides, carbides, and borides in a HEA ceramic matrix. The example path-ways to form this structure is as following.

(a) By post annealing as shown in FIG. 3b: By tuning the matrix composition appropriately for metallic, and non-metallic lattice, a desired precipitation of phases is achieved in a HEA matrix. The example in FIG. 3a shows WAlTiSiN alloy, where few nm scale precipitates are achieved by thermal annealing. The size of the precipitate, chemistry, and the interface structure of the precipitate is tuned by the alloy composition, and time, and temperature of the annealing cycle.

(b) To enable similar precipitates in the as-deposited coating, the deposition chamber is additionally equipped with an additional heating source that can instantaneously heat the substrate surface to a temperature between 900° C. and 1000° C. in a few seconds up to a depth of a few nanometers, hence forth called as flash heating. The source of flash heating can be a nanosecond laser, electron heating with filament etc. Energy of the flash heater is tuned such a way that only the surface few nm are heated for every exposure. The chamber is designed such a way that the coated substrates is alternatively exposed to coating, and a flash heating source as schematically shown in FIG. 3c. When the coated substrate is exposed to the flash heating source, the local heating enables decomposition of a given alloy and results in a controlled precipitate structure. The composition of the matrix and precipitate are tuned by the choice of alloy composition, the energy input and time of the flash heating cycle following the thermodynamic rule of free energy minimization combined with the controlled kinetics available during the flash heating. The coating growth continues by coating deposition, and flash heating to form a HEA matrix and controlled precipitate structure in a sequential way.

In the proposed method, formation of the precipitate structure and the host matrix is guided by alloy choice.

a) Alloying elements that can form entropy stabilized solid solutions are screened using the first principles calculations similar to the example of $Ti_{37}Al_{34}Si_{12}V_{17}N$ where the solid solution has lower $\Delta G_{mix}$ relative to their all competing states.

b) Precipitate structure are formed by having alloying elements/components like BN, $Al_2O_3$, and $V_2O_5$ that do not mix with the above mentioned HEA matrix by careful thermodynamic considerations. The necessary kinetics required to form the precipitates are provided either by post annealing or by flash heating in-situ during a coating deposition. Based on the selected alloy, and precipitate combination, a reactive atmosphere is created in the chamber comprising for example nitrogen and/or oxygen, and/or $CH_4$ separately or a mixture of them as needed.

Some examples, but not limited to are precipitates of BN, $Al_2O_3$, and VC in a HEA matrix of $Ti_{37}Al_{34}Si_{12}V_{17}N$ to enable additional functional properties of the coating.

The invention claimed is:

1. A PVD coating process for producing a multifunctional coating structure comprising the steps of:
   Producing a HEA ceramic matrix on a substrate, and
   Targeted introduction of a controlled precipitate structure into the HEA ceramic matrix to generate a desired specific property of the coating structure,
   wherein the targeted introduction of the controlled precipitate structure into the HEA ceramic matrix takes place via a thermal treatment, and only less than 50 nm are heated directly in the HEA ceramic matrix layer by means of the thermal treatment and the targeted introduction of the controlled precipitate structure into the HEA ceramic matrix takes place in situ during the production of the HEA ceramic matrix, and the controlled precipitate structure is introduced into the HEA ceramic matrix by means of an instantaneous heating source for heating the surface of the HEA ceramic matrix to a temperature of between 900° C. and 1000° C.

2. The PVD coating process according to claim 1, wherein a variation of the targeted introduction of the controlled precipitate structure takes place by varying at least the treatment time or the treatment temperature.

3. The PVD coating process according to claim 1, wherein the HEA matrix is deposited on a substrate by applying a negative bias voltage to the substrate during the coating process, wherein the bias voltage is <200 V.

4. The PVD coating process according to claim 1, wherein at least the production of the HEA ceramic matrix or the controlled precipitate structure takes place within a reactive atmosphere.

5. The PVD coating process according to claim 1, wherein a sputtering technique is used as the PVD coating process.

6. The PVD coating process according to claim 1, wherein the substrate temperature during the production of at least the HEA ceramic matrix or the controlled precipitate structure is between 100° C. and 400° C.

7. The PVD coating process according to claim 1, wherein the process is conducted in a chamber designed in such a way that the coated substrate is alternately exposed to coating and the instantaneous heating source, and wherein the coating growth continues by coating deposition and instantaneous heating, in this manner forming the HEA matrix and the controlled precipitate structure in a sequential way.

* * * * *